(12) United States Patent
Forbes et al.

(10) Patent No.: US 6,352,933 B1
(45) Date of Patent: Mar. 5, 2002

(54) METHODS OF FORMING INSULATING MATERIALS BETWEEN CONDUCTIVE COMPONENTS AND METHODS OF FORMING INSULATING MATERIALS AROUND A CONDUCTIVE COMPONENT

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/760,181

(22) Filed: Jan. 12, 2001

Related U.S. Application Data

(62) Division of application No. 08/948,372, filed on Oct. 9, 1997.

(51) Int. Cl.$^7$ ..................... H01L 21/311; H01L 21/302
(52) U.S. Cl. ..................... 438/703; 438/705; 438/745
(58) Field of Search ..................... 438/691, 692, 438/693, 694, 697, 698, 745, 746, 753, 705, 703

(56) References Cited

U.S. PATENT DOCUMENTS

| | | | |
|---|---|---|---|
| 3,919,060 A | 11/1975 | Pogge et al. | 204/129.3 |
| 3,954,523 A | 5/1976 | Magdo et al. | 148/175 |
| 3,979,230 A | 9/1976 | Anthony et al. | 148/1.5 |
| 3,998,662 A | 12/1976 | Anthony et al. | 148/1.5 |
| 4,063,901 A * | 12/1977 | Shiba | 29/578 |
| 4,180,416 A * | 12/1979 | Brock | 148/1.5 |
| 4,561,173 A | 12/1985 | Te Velde | 156/644 |
| 5,023,200 A | 6/1991 | Blewer et al. | 437/187 |
| 5,103,288 A | 4/1992 | Sakamoto et al. | 357/71 |
| 5,141,896 A | 8/1992 | Katoh | 437/195 |
| 5,149,615 A | 9/1992 | Chakravorty et al. | 430/313 |
| 5,171,713 A | 12/1992 | Matthews | 437/189 |
| 5,192,834 A | 3/1993 | Yamanishi et al. | |
| 5,266,519 A | 11/1993 | Iwamoto | 437/183 |
| 5,286,668 A | 2/1994 | Chou | |
| 5,461,003 A | 10/1995 | Havemann et al. | 437/787 |
| 5,464,786 A | 11/1995 | Figura et al. | 437/52 |
| 5,470,801 A | 11/1995 | Kapoor et al. | 437/238 |
| 5,488,015 A * | 1/1996 | Havemann et al. | 437/195 |
| 5,496,773 A | 3/1996 | Rhodes et al. | 437/189 |
| 5,525,857 A | 6/1996 | Gnade et al. | 313/309 |
| 5,527,737 A * | 6/1996 | Jeng | 437/195 |
| 5,554,567 A | 9/1996 | Wang | 437/195 |
| 5,559,666 A | 9/1996 | Figura et al. | 361/321.4 |

(List continued on next page.)

FOREIGN PATENT DOCUMENTS

| | | | | |
|---|---|---|---|---|
| EP | 0 542 262 A | 5/1993 | | H01L/21/90 |
| EP | 0 923 125 A | 6/1999 | | H01L/21/768 |

OTHER PUBLICATIONS

Anderson et al. Porous Polycrystalline Silicon: a new material for MEMS, Jornal of Microelectromechanical Systems, vol. 3, No. 1, p. 10–18. (Abstract Only).*

(List continued on next page.)

Primary Examiner—Benjamin L. Utech
Assistant Examiner—Matthew Anderson
(74) Attorney, Agent, or Firm—Wells, St. John, Roberts, Gregory & Matkin P.S.

(57) ABSTRACT

In one aspect, the invention encompasses a method of forming an insulating material around a conductive component. A first material is chemical vapor deposited over and around a conductive component. Cavities are formed within the first material. After the cavities are formed, at least some of the first material is transformed into an insulative second material. In another aspect, the invention encompasses a method of forming an insulating material. Polysilicon is deposited proximate a substrate. A porosity of the polysilicon is increased. After the porosity is increased, at least some of the polysilicon is transformed into silicon dioxide.

50 Claims, 2 Drawing Sheets

U.S. PATENT DOCUMENTS

| | | | |
|---|---|---|---|
| 5,583,078 A | 12/1996 | Osenbach | 437/240 |
| 5,599,745 A | 2/1997 | Reinberg | 437/195 |
| 5,629,238 A | 5/1997 | Choi et al. | 438/645 |
| 5,654,224 A | 8/1997 | Figura et al. | 438/396 |
| 5,670,828 A | 9/1997 | Cheung et al. | 257/773 |
| 5,691,565 A | 11/1997 | Manning | 257/632 |
| 5,691,573 A | 11/1997 | Avanzino et al. | 257/758 |
| 5,736,425 A | 4/1998 | Smith et al. | 438/778 |
| 5,744,399 A | 4/1998 | Rostoker et al. | 438/622 |
| 5,773,363 A | 6/1998 | Derderian et al. | 438/672 |
| 5,804,508 A | 9/1998 | Gnade et al. | 438/778 |
| 5,807,607 A | 9/1998 | Smith et al. | 427/96 |
| 5,808,854 A | 9/1998 | Figura et al. | 361/321.4 |
| 5,861,345 A | 1/1999 | Chou et al. | 438/763 |
| 5,882,978 A | 3/1999 | Srinivasan et al. | 430/396 |
| 5,883,014 A | 3/1999 | Chen et al. | 438/782 |
| 5,950,102 A | 9/1999 | Lee | 438/619 |
| 5,970,360 A * | 10/1999 | Cheng et al. | 438/398 |
| 6,001,747 A | 12/1999 | Annapragada | 438/790 |
| 6,028,015 A | 2/2000 | Wang et al. | 438/789 |
| 6,156,374 A * | 12/2000 | Forbes et al. | 427/97 |
| 6,251,470 B1 * | 6/2001 | Forbes et al. | 427/97 |

OTHER PUBLICATIONS

Wolf, Ph.D et al.., *Silicon Processing for the VLSI Era—vol. 1: Process Technology*, Lattice Press ©1986, pp. 1–8.

Wolf, Ph.D., et al., Silicon Processing for the VLSI Era—vol. 1: Process Technology, Lattice Press ©1986, pp. 429–437.

Yoon et al., "Monolithic Integration of 3–D Electroplated Microstructures with Unlimited Number of Levels using Planarization with a Sacrificial Metallic Mold", IEEE International Micro–Electro Mechanical Systems Conference; 1999; pp. 624 & 627–629.

Togo, M., "A Gate–side Air–gap Structure (GAS) to Reduce the Parasitic Capacitance in MOSFETs", 1996 Sympos. on VLSI Technology Digest Of Technical Papers, IEEE 1996, pp. 38–39.

Anand, M.B., "NURA: A Feasible, Gas–Dielectric Interconnect Process", 1996 Sympos. on VLSI Technology Digest of Technical Papers, IEEE 1996, pp. 82–83.

Watanabe, H., "A Novel Stacked Capacitor with Porous–Si Electrodes for High Density DRAMs", Microelectronics Research Laboratories, NEC Corp. date unknown, pp. 17–18.

Abstract: Anderson, R.C. et al., "Porous Polycrystalline Silicon: A New Material For MEMS", Jnl. of Microelectromechanical Systems (Mar. 1994), vol. 3, No. 1, pp. 10–18.

Singer, Peter, "The New Low–k Candidate: It's a Gas", (Technology News/Wafer Processing) *Semiconductor International*, 1 Page, (Mar. 1989).

Low Dielectric Constant Materials and Methods for Interlayer Dielectric Films in Ultralarge–Scale Integrated Circuit Multilevel Interconnections, Tetsuya Homma, *Materials Science & Engr.*, R23, pp. 243–285 (1998).

Product Brochure and Material Safety Data Sheet, Inerlayer Dielelctric *JSR Microelectronics*, 12 pages (1997).

Abstract: Silk Polymer Coating With Low Dielectric Constant and High Thermal Stability for ULSI Interlayer Dielectric, P.H. Townsend et al., The Dow Chemical Company, Midland, MI, 9 pages (Undated).

*Silicon Processing for the VLSI Era—vol. 1: Process Technology*, Wolf, Ph.D. et al., Lattice Press ©1986, pp. 429–437.

U.S. application No. 08/647,847, Juengling et al., filed Oct. 9, 1997.

* cited by examiner

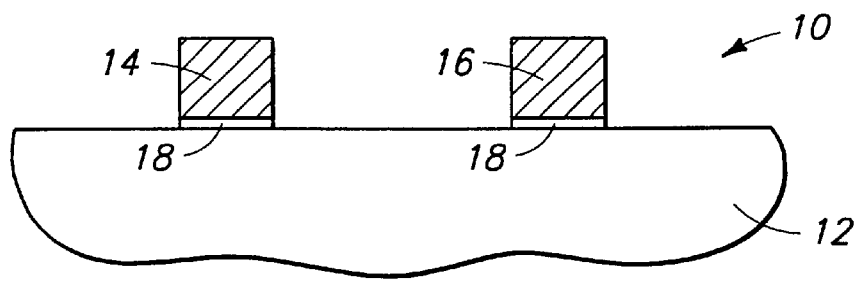
_FIG. 1_
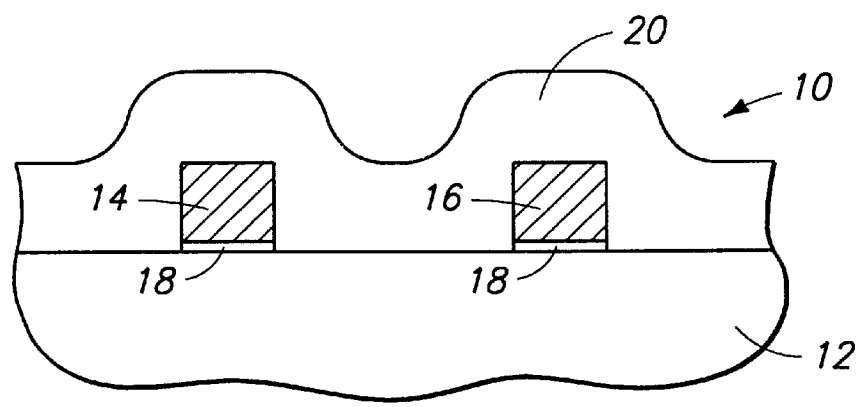
_FIG. 2_
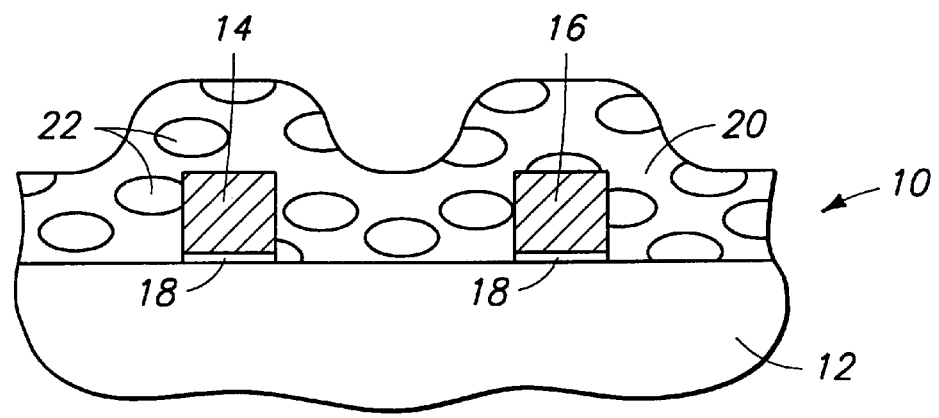
_FIG. 3_

METHODS OF FORMING INSULATING MATERIALS BETWEEN CONDUCTIVE COMPONENTS AND METHODS OF FORMING INSULATING MATERIALS AROUND A CONDUCTIVE COMPONENT

RELATED PATENT DATA

This patent is a Divisional Application of U.S. patent application Ser. No. 08/948,372, filed Oct. 9, 1997, entitled "Methods of Forming an Insulating Material Proximate a Substrate, and Methods of Forming an Insulating Material Between Components of an Integrated Circuit", naming Leonard Forbes and Kie Y. Ahn as inventors, the disclosure of which is incorporated by reference.

TECHNICAL FIELD

The invention pertains to methods of forming insulating material, such as for example, methods of forming insulating material between components of integrated circuits.

BACKGROUND OF THE INVENTION

In methods of forming integrated circuits, it is frequently desired to isolate components of the integrated circuits from one another with insulative material. Such insulative material may comprise a number of materials, including, for example, silicon dioxide, silicon nitride, and undoped semiconductive material, such as silicon. Although such materials have acceptable insulative properties in many applications, the materials disadvantageously have high dielectric constants which can lead to capacitive coupling between proximate conductive elements. For instance, silicon dioxide has a dielectric constant of about 4, silicon nitride has a dielectric constant of about 8, and undoped silicon has a dielectric constant of about 12.

It would be desirable to develop alternative methods for insulating conductive elements from one another with low-dielectric-constant materials.

SUMMARY OF THE INVENTION

The invention encompasses methods of forming insulating materials proximate conductive elements.

In one aspect, the invention encompasses a method of forming an insulating material proximate a substrate in which a first material is chemical vapor deposited proximate the substrate. Cavities are formed within the first material, and, after forming the cavities, at least some of the first material is transformed into an insulative second material.

In another aspect, the invention encompasses a method of forming an insulating material proximate a substrate in which porous polysilicon is formed proximate the substrate and at least some of the porous polysilicon is transformed into porous silicon dioxide.

In yet another aspect, the invention encompasses a method of forming an insulating material between components of an integrated circuit. Polysilicon is chemical vapor deposited between two components and electrochemically anodized to convert the polysilicon into a porous mass having a first volume. The first volume comprises a polysilicon volume and a cavity volume, with the cavity volume comprising greater than or equal to about 75% of the first volume. The porous polysilicon mass is oxidized to transform the polysilicon into porous silicon dioxide having a second volume. The second volume comprises a silicon dioxide volume and a cavity volume, with the cavity volume comprising less than or equal to about 50% of said second volume.

BRIEF DESCRIPTION OF THE DRAWINGS

Preferred embodiments of the invention are described below with reference to the following accompanying drawings.

FIG. 1 is a diagrammatic cross-sectional view of a semiconductor wafer fragment at a preliminary step of a processing method of the present invention.

FIG. 2 is a view of the FIG. 1 wafer fragment shown at a processing step subsequent to that of FIG. 1.

FIG. 3 is a view of the FIG. 1 wafer fragment shown at a processing step subsequent to that of FIG. 2.

DETAILED DESCRIPTION OF THE PREFERRED EMBODIMENTS

Figure 4:
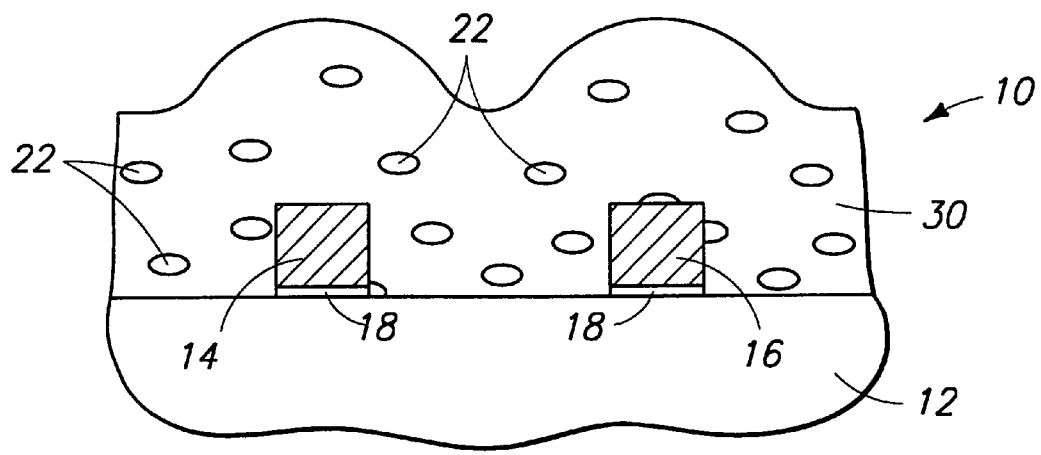
FIG. 4 is a view of the FIG. 1 wafer fragment shown at a processing step subsequent to that of FIG. 3.

This disclosure of the invention is submitted in furtherance of the constitutional purposes of the U.S. Patent Laws "to promote the progress of science and useful arts" (Article 1, Section 8).

FIG. 1 shows a semiconductive wafer fragment 10 at a preliminary processing step of the present invention. Wafer fragment 10 comprises a substrate 12 and conductive elements 14 and 16 overlying substrate 12. Substrate 12 may comprise, for example, a monocrystalline silicon wafer. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive elements 14 and 16 may comprise, for example, conductive lines. Conductive elements 14 and 16 might be part of an integrated circuit, for example. Although conductive elements 14 and 16 are illustrated as being horizontally displaced, such elements could also be displaced along a non-horizontal axis. For example, such elements could be vertically displaced from one another.

An insulative material 18 is formed between substrate 12 and conductive elements 14 and 16. Insulative material 18 can comprise a number of materials known to persons of ordinary skill in the art, such as, for example, silicon nitride and silicon dioxide. Insulative material 18 is provided to electrically isolate conductive elements 14 and 16 from substrate 12. Such electrical isolation might be desired, for example, if substrate 12 is conductive or semiconductive.

Referring to FIG. 2, a first material 20 is deposited proximate substrate 12 and between conductive elements 14 and 16. First material 20 preferably comprises polysilicon, and is preferably formed by chemical vapor depositing. Methods for chemical vapor depositing polysilicon are known to persons of ordinary skill in the art, and include, for example, methods comprising thermal decomposition of silane.

Referring to FIG. 3, cavities 22 are formed within first material 20. The formation of cavities 22 within first material 20 converts first material 20 into a porous first material. In a preferred example in which first material 20 comprises polysilicon, cavities 22 may be formed by, for example, either electrochemical anodization or by subjecting the polysilicon to a chemical etch. An example method of electrochemical anodization comprises doping preferred polysilicon layer 20 and making wafer fragment 10 an anode in an aqueous hydrofluoric acid solution. The hydrofluoric acid solution can comprise, for example, 20 wt.% HF, and the amount of current applied with wafer fragment 10 as anode can comprise, for example, about 10 mA for a 100 mm diameter wafer. An example method of chemical etching comprises doping preferred polysilicon layer 20 with a p-type conductivity-enhancing dopant and subsequently chemically etching layer 20 with a phosphoric acid solution.

Preferably, greater than about 50% of a volume of layer 20 will be removed in forming cavities 22. More preferably, at least about 75% of a volume of layer 20 will be removed in forming cavities 22. In other words, the formation of cavities 22 converts the first material of layer 20 into a porous mass having a first volume which comprises a polysilicon volume and a cavity volume, wherein the cavity volume is most preferably greater than or equal to about 75% of the first volume.

Referring to FIG. 4, first material 20 (shown in FIG. 3) is transformed into an insulative second material 30. Where the first material 20 comprises polysilicon, such transformation can occur, for example, by oxidizing polysilicon layer 20 to transform such polysilicon layer to a silicon dioxide layer 30. Methods for oxidizing a polysilicon layer are known to persons of ordinary skill in the art, and include, for example, thermal oxidation utilizing one or more of the oxygen-containing compounds $O_2$, $O_3$ and $H_2O$. In the shown embodiment, substantially all of first material 20 is transformed into insulative second material 30. However, it is to be understood that the invention also encompasses embodiments in which only some of first material 20 is transformed into insulative second material 30. In the shown preferred embodiment, oxidation of polysilicon layer 20 (shown in FIG. 3) having a first volume swells the layer into a silicon dioxide layer 30 having a second volume which is larger than the first volume. The increase in volume of layer 30 relative to layer 20 changes the relative volume occupied by cavities 22. For instance, in an example embodiment in which cavities 22 comprise a cavity volume greater than or equal to about 75% of a first volume of porous polysilicon layer 20 (shown in FIG. 3), the cavity volume can comprise less than or equal to about 50% of a volume of porous silicon dioxide layer 30 formed by oxidizing such layer 20.

The cavities 22 within second material layer 30 lower a dielectric constant of the material relative to what the dielectric constant would be in the absence of cavities 22. Cavities 22 will preferably be filled with some gas. Gases typically have a dielectric constant of about 1, which is less than a dielectric constant of most commonly used insulative materials. For instance, if the insulative solid material of layer 30 comprises silicon dioxide, the silicon dioxide will typically have a dielectric constant of about 4. The addition of cavities 22 within material layer 30 decreases the dielectric constant of the material 30 to less than 4. In the above-described embodiment in which cavities 22 comprise about 50% of the total volume of layer 30, and in which layer 30 comprises silicon dioxide, layer 30 can have a dielectric constant of about 1.6. Accordingly, the method of the present invention can form a porous silicon dioxide insulative layer having a dielectric constant of less than or equal to about 1.6.

Figure 5:
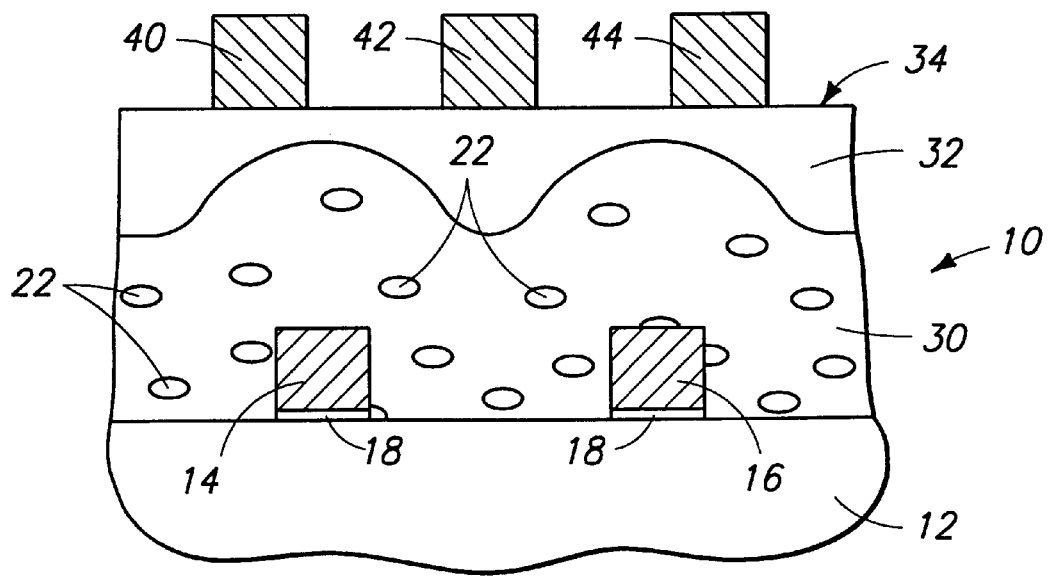
FIG. 5 is a view of the FIG. 4 wafer fragment shown at a processing step subsequent to that of FIG. 4.

As shown in FIG. 5, layer 30 can be utilized to support additional circuitry formed over conductive elements 14 and 16. In the shown embodiment, a filling layer 32 is provided over layer 30. Filling layer 32 can comprises any of a number of materials known to persons of ordinary skill in the art, including, for example, insulative materials such as silicon dioxide or silicon nitride. Filling layer 32 can be provided by, for example, chemical vapor deposition. Filling layer 32 is planarized, such as, for example, by chemical-mechanical polishing, to form a substantially planar upper surface 34.

After forming a planar upper surface 34 over layer 30, circuit elements 40, 42 and 44 are formed over the upper surface. Circuit elements 40, 42 and 44 can be formed by conventional methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an insulating material around a conductive component comprising:
   providing a conductive component supported on a substrate;
   chemical vapor depositing a first material over and around the conductive component;
   forming cavities within the first material; and
   after forming cavities within the first material, transforming the first material into an insulative second material.

2. The method of claim 1 wherein substantially all of the first material is transformed into the insulative second material.

3. The method of claim 1 wherein the first material comprises polysilicon.

4. The method of claim 1 wherein the transforming comprises oxidizing the first material.

5. A method of forming an insulating material around and against a conductive component comprising:
   providing a conductive component over a substrate, the conductive component extending upwardly from the substrate and having an upper surface and sidewalls extending beneath the upper surface;
   chemical vapor depositing polysilicon along and against the upper surface and sidewalls of the conductive component;
   forming cavities within the deposited polysilicon to enhance the porosity of the polysilicon; and
   after forming the cavities, oxidizing the polysilicon to transform the polysilicon to a porous silicon dioxide which is along and against the sidewalls and upper surface of the conductive component.

6. The method of claim 5 wherein the conductive component is a line of conductive material over the substrate.

7. The method of claim 5 wherein the silicon dioxide comprises cavities and a volume, and wherein the cavities comprise a volume that is less than or equal to about 50% of the volume of the silicon dioxide.

8. The method of claim 5 wherein the silicon dioxide comprises a dielectric constant of less than 4.

9. The method of claim 5 wherein the silicon dioxide comprises a dielectric constant of less than or equal to about 1.6.

10. The method of claim 5, wherein providing a conductive component over a substrate comprises providing a conductive component over a monocrystalline silicon substrate.

11. A method of forming an insulating material around and against a conductive component comprising:
   providing a conductive component over a substrate, the conductive component extending upwardly from the substrate and having an upper surface and sidewalls extending beneath the upper surface;
   chemical vapor depositing polysilicon along and against the upper surface and sidewalls of the conductive component;
   forming cavities within the deposited polysilicon to enhance the porosity of the polysilicon;
   after forming the cavities, oxidizing the polysilicon to transform the polysilicon to a porous silicon dioxide which is along and against the sidewalls and upper surface of the conductive component, the porous silicon dioxide being a first insulative material and having a non-planar upper surface comprising peaks and valleys between the peaks;
   forming a second insulative material over the first insulative material to cover the peaks and fill the valleys between the peaks; and
   planarizing an upper surface of the second insulative material.

12. The method of claim 11 wherein the second insulative material is selected from the group comprising silicon dioxide and silicon nitride.

13. The method of claim 11 wherein the silicon dioxide comprises cavities and a volume, and wherein the cavities comprise a volume that is less than or equal to about 50% of the volume of the silicon dioxide.

14. The method of claim 11 wherein the silicon dioxide comprises a dielectric constant of less than 4.

15. The method of claim 11 wherein the silicon dioxide comprises a dielectric constant of less than or equal to about 1.6.

16. The method of claim 11 wherein the second insulative material comprises silicon nitride.

17. The method of claim 11, wherein providing a conductive component over a substrate comprises providing a conductive component over a monocrystalline silicon substrate.

18. A method of forming an insulating material around and against a conductive component comprising:
   providing a conductive component over a substrate;
   chemical vapor depositing polysilicon to cover the conductive component;
   forming cavities within the deposited polysilicon to enhance the porosity of the polysilicon;
   after forming the cavities, oxidizing the polysilicon to transform substantially all of the polysilicon to a porous silicon dioxide which covers upper surfaces of the conductive component, the porous silicon dioxide being a first insulative material and having a non-planar upper surface comprising peaks and valleys between the peaks;
   forming a second insulative material over the first insulative material to cover the peaks and fill the valleys between the peaks;
   planarizing an upper surface of the second insulative material; and
   forming a second conductive component on the upper surface of the second insulative material, the first and second insulative materials insulating the first and second conductive components from each other.

19. The method of claim 18, wherein providing a conductive component over a substrate comprises providing a conductive component over a monocrystalline silicon substrate.

20. A method of forming an insulating material between conductive components comprising:
   providing a plurality of conductive components supported on a substrate;
   chemical vapor depositing polysilicon over and between the plurality of conductive components;
   forming cavities within the polysilicon to increase porosity of the polysilicon; and
   after forming cavities within the polysilicon, transforming the polysilicon into porous silicon dioxide.

21. The method of claim 20 wherein providing a plurality of conductive components comprises providing a pair of conductive lines horizontally displaced from one another.

22. The method of claim 20 further comprising forming circuitry above the porous silicon dioxide.

23. The method of claim 20 wherein providing a plurality of conductive components comprises providing a pair of conductive lines vertically displaced from one another.

24. A method of forming an insulating material between conductive components comprising:
   depositing polysilicon proximate a substrate and between conductive components supported by the substrate;
   increasing a porosity of the polysilicon; and
   after increasing the porosity, transforming the polysilicon into silicon dioxide.

25. The method of claim 24 wherein the silicon dioxide comprises cavities and a volume, and wherein the cavities comprise a volume that is less than or equal to about 50% of the volume of the silicon dioxide.

26. The method of claim 24 wherein the silicon dioxide comprises a dielectric constant of less than 4.

27. The method of claim 24 wherein the silicon dioxide comprises a dielectric constant of less than or equal to about 1.6.

28. A method of forming an insulating material between conductive components comprising:
   depositing polysilicon proximate a substrate and between conductive components supported by the substrate;
   forming cavities within the polysilicon to enhance porosity of the polysilicon; and
   after forming the cavities, transforming the polysilicon into porous silicon dioxide.

29. The method of claim 28 wherein the porous silicon dioxide comprises a volume, wherein the cavities comprise a cavity volume, and wherein the cavity volume is less than or equal to about 50% of the volume of the porous silicon dioxide.

30. The method of claim 28 wherein the forming cavities comprises electrochemical anodization.

31. The method of claim 28 wherein the forming cavities comprises subjecting the polysilicon to a chemical etch.

32. The method of claim 28 wherein the forming cavities comprises:
   doping the polysilicon with a p-type dopant; and
   subjecting the doped polysilicon to a phosphoric acid etch.

33. The method of claim 28 wherein the porous silicon dioxide comprises a dielectric constant of less than 4.

34. The method of claim 28 wherein the porous silicon dioxide comprises a dielectric constant of less than or equal to about 1.6.

35. A method of forming an insulating material between conductive components comprising:

forming polysilicon proximate a substrate and between conductive components supported by the substrate;

forming cavities within the polysilicon to enhance porosity of the polysilicon;

after forming the cavities, transforming the polysilicon into porous silicon dioxide; and forming at least one structure over the porous silicon dioxide.

36. The method of claim 35 wherein the formed polysilicon has a first volume before forming cavities, and wherein the forming cavities removes greater than about 50% of said first volume of the formed polysilicon.

37. The method of claim 35 wherein the forming polysilicon comprises chemical vapor deposition.

38. A method of forming an insulating material comprising:

depositing polysilicon proximate a substrate;

increasing a porosity of the polysilicon; and after increasing the porosity, transforming the polysilicon into silicon dioxide.

39. The method of claim 38 wherein the silicon dioxide comprises cavities and a volume, and wherein the cavities comprise a volume that is less than or equal to about 50% of the volume of the silicon dioxide.

40. The method of claim 38 wherein the silicon dioxide comprises a dielectric constant of less than 4.

41. The method of claim 38 wherein the silicon dioxide comprises a dielectric constant of less than or equal to about 1.6.

42. A method of forming an insulating material comprising:

depositing polysilicon proximate an element chosen from a group consisting of: a substrate and a conductive component supported on a substrate;

forming cavities within the polysilicon to enhance porosity of the polysilicon; and after forming the cavities, transforming the polysilicon into porous silicon dioxide.

43. The method of claim 42 wherein the porous silicon dioxide comprises a volume, wherein the cavities comprise a cavity volume, and wherein the cavity volume is less than or equal to about 50% of the volume of the porous silicon dioxide.

44. The method of claim 42 wherein the formed polysilicon has a first volume before forming cavities, and wherein the forming cavities removes greater than about 50% of said first volume of the formed polysilicon.

45. The method of claim 42 wherein the forming polysilicon comprises chemical vapor deposition.

46. The method of claim 42 wherein the forming cavities comprises electrochemical anodization.

47. The method of claim 42 wherein the forming cavities comprises subjecting the polysilicon to a chemical etch.

48. The method of claim 42 wherein the forming cavities comprises:

doping the polysilicon with a p-type dopant; and subjecting the doped polysilicon to a phosphoric acid etch.

49. The method of claim 42 wherein the porous silicon dioxide comprises a dielectric constant of less than 4.

50. The method of claim 42 wherein the porous silicon dioxide comprises a dielectric constant of less than or equal to about 1.6.

* * * * *

UNITED STATES PATENT AND TRADEMARK OFFICE
CERTIFICATE OF CORRECTION

PATENT NO.      : 6,352,933 B1
DATED           : March 5, 2002
INVENTOR(S)     : Leonard Forbes et al.

It is certified that error appears in the above-identified patent and that said Letters Patent is hereby corrected as shown below:

<u>Title page,</u>
Item [56], References Cited, OTHER PUBLICATIONS, replace U.S. application No. 08/647,847, Juengling et al.," with -- U.S. application No. 08/947,847, Juengling et al., --

Signed and Sealed this

Thirty-first Day of December, 2002

JAMES E. ROGAN
*Director of the United States Patent and Trademark Office*